(12) United States Patent
Wu et al.

(10) Patent No.: US 9,349,922 B2
(45) Date of Patent: May 24, 2016

(54) MASK, MASK GROUP, MANUFACTURING METHOD OF PIXELS AND PIXEL STRUCTURE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Haidong Wu, Beijing (CN); Tae Gyu Kim, Beijing (CN); Qun Ma, Beijing (CN); Juanjuan Bai, Beijing (CN)

(73) Assignees: BOE TECHNOLOGY GROUP CO., LTD., Beijing (CN); ORDOS YUANSHENG OPTOELECTRONICS CO., LTD., Ordos, Innver Mongolia (CN)

(*) Notice: Subject to any disclaimer, the term of this patent is extended or adjusted under 35 U.S.C. 154(b) by 0 days.

(21) Appl. No.: 14/646,915

(22) PCT Filed: Dec. 29, 2014

(86) PCT No.: PCT/CN2014/095285
§ 371 (c)(1),
(2) Date: May 22, 2015

(65) Prior Publication Data
US 2016/0056342 A1    Feb. 25, 2016

(30) Foreign Application Priority Data

Aug. 25, 2014  (CN) .......................... 2014 1 0421343

(51) Int. Cl.
*H01L 27/146* (2006.01)
*H01L 33/44* (2010.01)
(Continued)

(52) U.S. Cl.
CPC .............. *H01L 33/44* (2013.01); *C23C 14/042* (2013.01); *H01L 33/08* (2013.01)

(58) Field of Classification Search
CPC . H01L 33/44; H01L 2924/0002; H01L 51/56; H01L 21/0332; H01L 21/027; H01L 21/266; C23C 14/042
USPC ............. 257/98, 435, E21.258; 438/551, 942
See application file for complete search history.

(56) References Cited

U.S. PATENT DOCUMENTS 6,534,425 B1 * 3/2003 Karr ........................ G03F 1/144
250/492.2
6,660,462 B1 * 12/2003 Fukuda ..................... G03F 1/36
430/313

(Continued)

FOREIGN PATENT DOCUMENTS

CN   103715227 A   4/2014
CN   103854570 A   6/2014

(Continued)

OTHER PUBLICATIONS

International Search Report mailed Mar. 27, 2015; PCT/CN2014/095285.

(Continued)

*Primary Examiner* — Yosef Gebreyesus
(74) *Attorney, Agent, or Firm* — Ladas & Parry LLP

(57) ABSTRACT

Embodiments of the disclosure provide a mask, a mask group, a manufacturing method of pixels and a pixel structure. The mask includes a shielding region and an opening region which are alternately arranged. A width of the opening region is twice of a width of one sub pixel, and a width of the shielding region between two adjacent opening regions is four times of the width of one sub pixel.

18 Claims, 4 Drawing Sheets

(51) Int. Cl.
*H01L 33/08* (2010.01)
*C23C 14/04* (2006.01)

(56) References Cited

U.S. PATENT DOCUMENTS

| | | | | |
|---|---|---|---|---|
| 6,919,681 B2* | 7/2005 | Cok | ............ | G09G 3/3216 |
| | | | | 313/500 |
| 7,439,667 B2* | 10/2008 | Ohtani | ............ | H05B 33/0821 |
| | | | | 313/500 |
| 7,573,192 B2 | 8/2009 | Kawabe | | |
| 7,827,521 B2* | 11/2010 | Fujii | ............ | H01L 22/12 |
| | | | | 438/149 |
| 7,977,870 B2* | 7/2011 | Ho | ............ | H01L 27/3213 |
| | | | | 313/504 |
| 8,174,008 B1* | 5/2012 | Chiang | ............ | H01L 51/56 |
| | | | | 257/40 |
| 9,070,323 B2* | 6/2015 | Cok | ............ | G09G 3/3266 |
| 2002/0024618 A1* | 2/2002 | Imai | ............ | H04N 9/3114 |
| | | | | 348/743 |
| 2003/0137325 A1* | 7/2003 | Yamazaki | ............ | H01L 27/322 |
| | | | | 327/80 |
| 2004/0239586 A1* | 12/2004 | Cok | ............ | G09G 3/3266 |
| | | | | 345/55 |
| 2005/0099689 A1* | 5/2005 | Fukushima | ............ | G02B 27/22 |
| | | | | 359/466 |
| 2005/0151146 A1* | 7/2005 | Lee | ............ | H01L 21/2026 |
| | | | | 257/98 |
| 2005/0211981 A1* | 9/2005 | Yotsuya | ............ | C23C 14/042 |
| | | | | 257/64 |
| 2007/0037070 A1* | 2/2007 | Ohnuma | ............ | G03F 1/144 |
| | | | | 430/5 |
| 2008/0003350 A1* | 1/2008 | Kim | ............ | C23C 14/042 |
| | | | | 427/66 |
| 2011/0157575 A1* | 6/2011 | Lee | ............ | C23C 14/042 |
| | | | | 355/72 |
| 2012/0064651 A1* | 3/2012 | Shiozaki | ............ | H01L 27/3211 |
| | | | | 438/35 |
| 2014/0004641 A1* | 1/2014 | Sonoda | ............ | C23C 14/042 |
| | | | | 438/34 |
| 2015/0235617 A1 | 8/2015 | Guo et al. | | |

FOREIGN PATENT DOCUMENTS

| | | |
|---|---|---|
| JP | 2004-311319 A | 11/2004 |
| WO | 2014/126033 A1 | 8/2014 |

OTHER PUBLICATIONS

Written Opinion of the International Searching Authority mailed Mar. 27, 2015; PCT/CN2014/095285.
First Chinese Office Action dated Nov. 27, 2015; Appln. No. 201410421343.5.

* cited by examiner

MASK, MASK GROUP, MANUFACTURING METHOD OF PIXELS AND PIXEL STRUCTURE

TECHNICAL FIELD

Embodiments of the disclosure relate to a mask, a mask group, a manufacturing method of pixels and a pixel structure.

BACKGROUND

Generally, one pixel of an Organic Light-Emitting Diode (OLED) display device comprises sub pixels of three colors of Red (R), Green (G) and Blue (B). Pixels Per Inch (PPI) determines the delicate degree of an image displayed by the display device. The higher the PPI is, the more delicate the image is. The key to increase the PPI is how to reduce the size of a single sub pixel.

At present, pixels of the OLED display device are formed by a vacuum evaporation process with a Fine Metal Mask (FMM). In the forming process, regions where the sub pixels of two colors are to be formed are shielded by the mask whereas a region where the sub pixel of the remaining one color is to be formed is exposed, so as to form the sub pixel of the remaining one color by evaporation. As shown in FIG. 1, an upper part of the diagram illustrates a plane view of a mask, and a lower part of the diagram illustrates a sectional view of the mask; the mask comprises a shielding region 101 and an opening region 102, and a side wall of the shielding region 101 has a certain side wall inclined angle $\theta$. The smaller the side wall inclined angle $\theta$ is, the larger an opening on the top of the opening region 102 is, then particles more easily get to an edge at the bottom of the opening region 102, and the size and shape of the evaporated sub pixel are closer to ideal size and shape. That is, the size of the side wall inclined angle $\theta$ determines the quality of the evaporation effect. At present, the side wall inclined angle $\theta$ is generally 40°-60°.

If d denotes a thickness of the mask, w denotes a width of the shielding region 101, and s denotes a width of the opening region 102, then a width of one sub pixel is $p=s=0.5$ w. If a is a width of a vertical projection of the side wall of the shielding region 101 on the bottom of the shielding region 101, and b is a width of a vertical projection of the top portion of the shielding region 101 on the bottom of the shielding region 101, then the width of the shielding region 101 is $w=2a+b$. Therefore, the width of one sub pixel is $p=0.5(2a+b)=a+0.5b=(d/\tan\theta)+0.5$ b. It is thus clear that in a case where $\theta$ is given, the width of the sub pixel is limited to the thickness d of the mask; the thinner the mask is, the smaller the sub pixels is, and the larger the PPI is.

However, the thinner the mask is, the more difficult the manufacturing process of the mask is, and the higher the manufacturing cost of the mask is. At present, the thickness of the mask used for forming the pixels of the OLED by evaporation is usually 40 μm, and the smallest is 30 μm. However, even the mask with the smallest thickness of 30 μm is adopted, the PPI of the OLED is still not greatly improved, which results in that the delicate degree of the image of the OLED display device cannot be further improved.

SUMMARY

Embodiments according to the disclosure provide a mask. The mask comprises a shielding region and an opening region which are alternately arranged. A width of the opening region is twice of a width of one sub pixel, and a width of the shielding region between two adjacent opening regions is four times of the width of one sub pixel.

For example, a leftmost region in the mask is the shielding region or the opening region.

For example, a width of the leftmost region in the mask is one, two, three or four times of the width of one sub pixel.

For example, the leftmost regions of the masks for forming sub pixels of different colors are different.

The embodiments according to the disclosure provide a mask group, for manufacturing a first sub pixel, a second sub pixel and a third sub pixel of different colors. The mask group comprises: a first mask, a second mask and a third mask. The first mask is configured for manufacturing the first sub pixel, and the first mask is the mask as described above. The second mask is configured for manufacturing the second sub pixel, and the second mask is the mask as described above. In the case that the second mask and the first mask are completely overlapped with each other, a vertical projection of the opening region of the second mask on the first mask and the opening region of the first mask are alternately distributed, and a distance between the vertical projection of the opening region of the second mask on the first mask and the opening region of the first mask, which is adjacent to the vertical projection of the opening region of the second mask on the first mask, is the width of one sub pixel. The third mask is configured for manufacturing the third sub pixel. The third mask comprises an opening region and a shielding region which are alternately arranged, a width of the opening region is the width of one sub pixel, and the width of the shielding region between two adjacent opening regions of the third mask is twice of the width of one sub pixel. In the case that the first mask, the second mask and the third mask are completely overlapped with one another, the vertical projection of the opening region of the second mask on the first mask and a vertical projection of the opening region of the third mask on the first mask are completely overlapped with the shielding region between two adjacent opening regions of the first mask.

For example, a leftmost region in the first mask is the shielding region, and a width of the leftmost region in the first mask is four times of the width of one sub pixel.

For example, the first sub pixel manufactured by the first mask is a red sub pixel.

For example, a leftmost region in the second mask is the shielding region, and a width of the leftmost region in the second mask is the width of one sub pixel.

For example, the second sub pixel manufactured by the second mask is a blue sub pixel.

For example, a leftmost region in the third mask is the opening region, and a width of the leftmost region in the third mask is the width of one sub pixel.

For example, the third sub pixel manufactured by the third mask is a green sub pixel.

The embodiments according to the disclosure provide a manufacturing method of pixels. The manufacturing method adopts the mask group as described above. The manufacturing method comprises: manufacturing the first sub pixel by using the first mask in the mask group; manufacturing the second sub pixel by using the second mask in the mask group; and manufacturing the third sub pixel by using the third mask in the mask group.

For example, the first sub pixel is a red sub pixel, the second sub pixel is a blue sub pixel, and the third sub pixel is a green sub pixel.

For example, the manufacturing the first sub pixel, the manufacturing the second sub pixel and the manufacturing the third sub pixel are performed in no specific order.

The embodiments according to the disclosure provide a pixel structure, and the pixel structure is manufactured by using the manufacturing method as described above.

For example, the pixel structure comprises a plurality of pixel repetition units, and each pixel repetition unit comprises six sub pixels of the first sub pixel, the third sub pixel, the second sub pixel, the second sub pixel, the third sub pixel and the first sub pixel which are arranged sequentially.

For example, the first sub pixel is a red sub pixel, the second sub pixel is a blue sub pixel, and the third sub pixel is a green sub pixel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
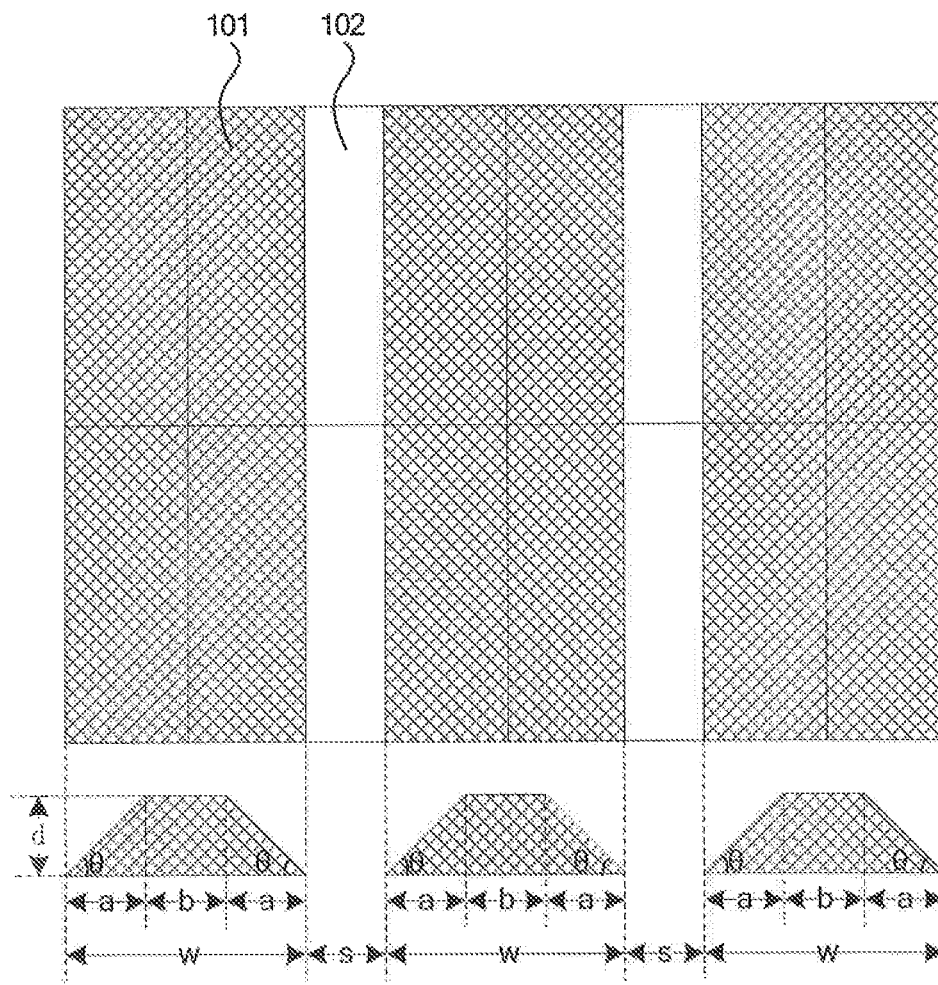
FIG. 1 is a plane structural diagram and a cross-sectional structural diagram illustrating a mask in the prior art.
Figure 2:
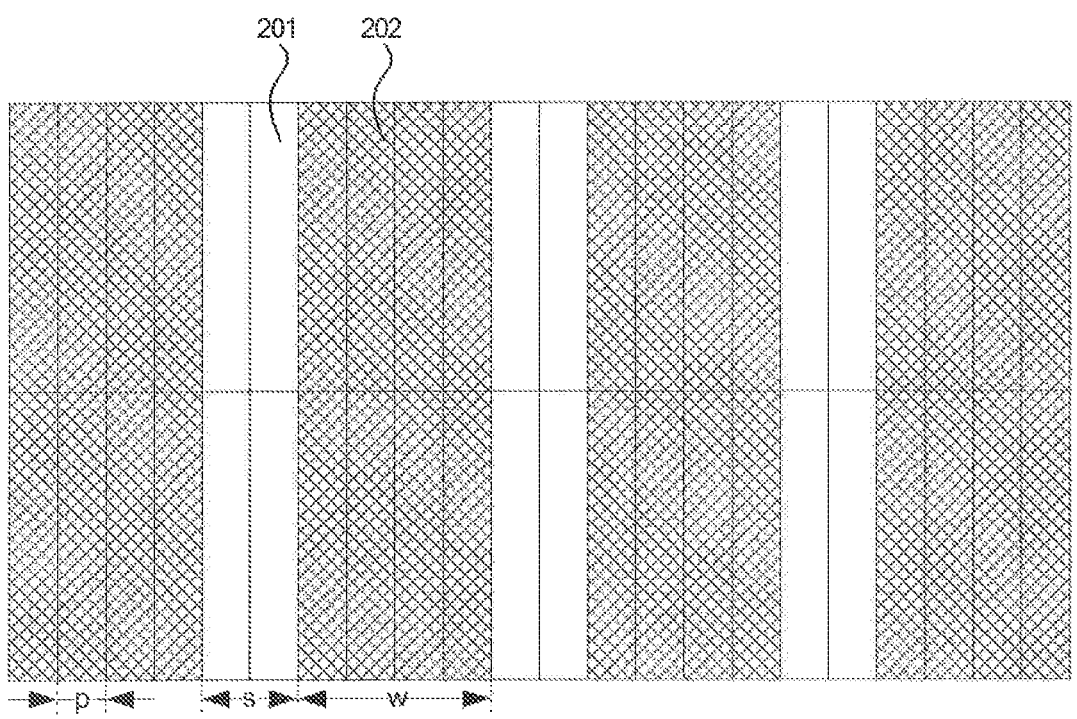
FIG. 2 is a plane structural diagram illustrating a mask according to embodiments of the disclosure.

Embodiments of the disclosure provide a mask. As shown in FIG. 2, the mask comprises: a shielding region 202 and an opening region 201 which are alternately arranged. A width s of the opening region 201 is twice of a width p of one sub pixel, and a width w of the shielding region 202 between two adjacent opening regions 201 is four times of the width p of one sub pixel.

In the mask, the width s of the opening region 201 is twice of the width p of one sub pixel, namely, the opening region 201 exposes two sub pixels; and the width w of the shielding region 202 between two adjacent opening regions 201 is four times of the width p of one sub pixel, namely, the shielding region 202 shields four sub pixels. In this case, if the widths of the opening region 201 and the shielding region 202 and the thickness d of the mask are kept unchanged compared with those of the mask in the prior art, the width p of the sub pixel formed by the mask in the embodiments is half of the width of the sub pixel formed by the mask in the prior art. The thickness d of the mask is in direct proportion to the manufacturing difficulty of the mask. The embodiments realize that the width p of the sub pixel is reduced while the manufacturing difficulty of the mask is not increased; accordingly, the limitation of the thickness d of the mask on the width p of the sub pixel is greatly reduced, the PPI of the display device is increased, and the delicate degree of the image displayed by the display device is greatly improved.

On the other hand, the available greatest thickness of the mask is the height of an isosceles triangle taking the width of the bottom of the shielding region 202 as a bottom side length and taking the side wall inclined angle θ of the shielding region 202 as a base angle; in this case, if the PPI of the manufactured display device is kept unchanged (namely, the width p of each sub pixel is kept unchanged) compared with the mask in the prior art, the width of the shielding region 202 of the mask in the embodiments is increased by one time compared with the width of the mask in the prior art. Furthermore, if the side wall inclined angle θ of the shielding region is kept unchanged compared with the mask in the prior art, it is apparent that the available greatest thickness of the mask in the embodiments is much larger than that of the mask in the prior art. That is to say, the embodiments realize that the pixels are manufactured with a thicker mask in the case that the PPI is not reduced. The thicker the mask is, the harder the mask is to deform, and the lower the manufacturing difficulty of the mask is, so the manufacturing difficulty of the mask is reduced by the embodiments.

Known from above analysis, a trade-off relationship exists between the thickness d of the mask and the width p of the sub pixel. In practical design and manufacture processes, it is unnecessary to keep the widths of the opening region 201 and the shielding region 202 and the thickness d of the mask unchanged to improve the PPI or it is unnecessary to keep the PPI unchanged to reduce the manufacturing difficulty of the mask. Based on the embodiments of the disclosure, the widths of the opening region 201 and the shielding region 202 may be properly increased so that the width of the formed sub pixel is smaller than the available smallest width in the prior art; on this basis, as the widths of the opening region 201 and the shielding region 202 are increased, the mask can be made thicker. It is thus clear that by adopting the mask according to the embodiments, the trade-off relation between the thickness d of the mask and the width p of the sub pixels is adjusted by adjusting the widths of the opening region 201 and the shielding region 202 and the thickness d of the mask, so the thickness d of the mask and the width p of the sub pixel achieve an optimal balance point according to practical requirements, which not only improves the PPI but also reduces the manufacturing difficulty of the mask.

As the sub pixels of different colors are distributed on different positions of a display plane of the display device, the structures of the masks for forming the sub pixels of different colors are different from each other, that is, the positions of the opening region and the shielding region of masks are different. As the opening region and the shielding region of the mask are alternately arranged, factors for determining the positions of the opening region and the shielding region are an initial region (if all regions comprising the opening region and the shielding region are arranged from left to right, a first arranged region is the initial region and the initial region is a region positioned at the leftmost side of the mask) and a width of the initial region. Particularly, the leftmost region in the mask (namely, the initial region of the mask) may be the shielding region 202 or the opening region 201, the leftmost regions of the masks for forming the sub pixels of different colors are different, the width of the leftmost region in the mask may be one, two, three or four times of the width p of one sub pixel, so as to enable the mask to meet the manufacturing demands of the sub pixels of different colors.

Based on the mask with above structure, the embodiments provide a mask group for manufacturing a first sub pixel, a second sub pixel and a third sub pixel of different colors. The mask group comprises: a first mask, a second mask and a third mask.

Figure 3A:
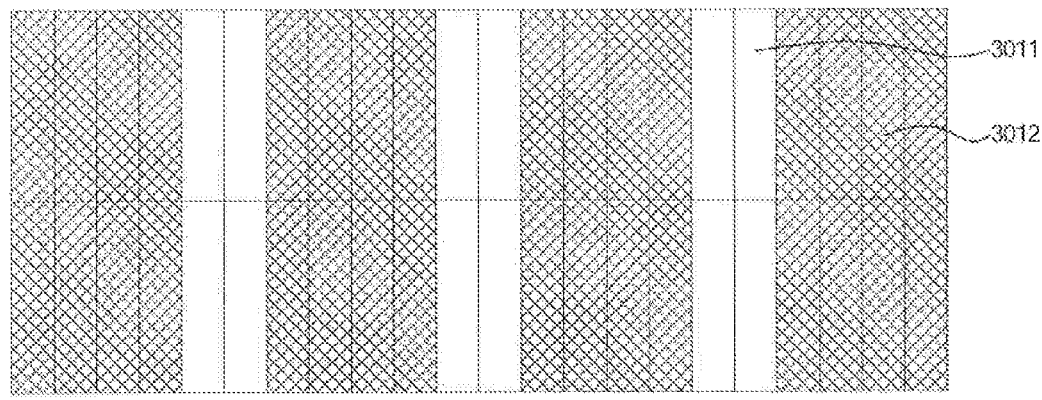
FIG. 3(a) is a plane structural diagram illustrating a first mask of a mask group according to the embodiments of the disclosure.

As shown in FIG. 3(a), the first mask is configured for manufacturing the first sub pixel, the first mask is the mask described above, the width s of an opening region 3011 is twice of the width p of one sub pixel, and the width w of a shielding region 3012 between two adjacent opening regions 3011 is four times of the width p of one sub pixel.

Figure 3B:
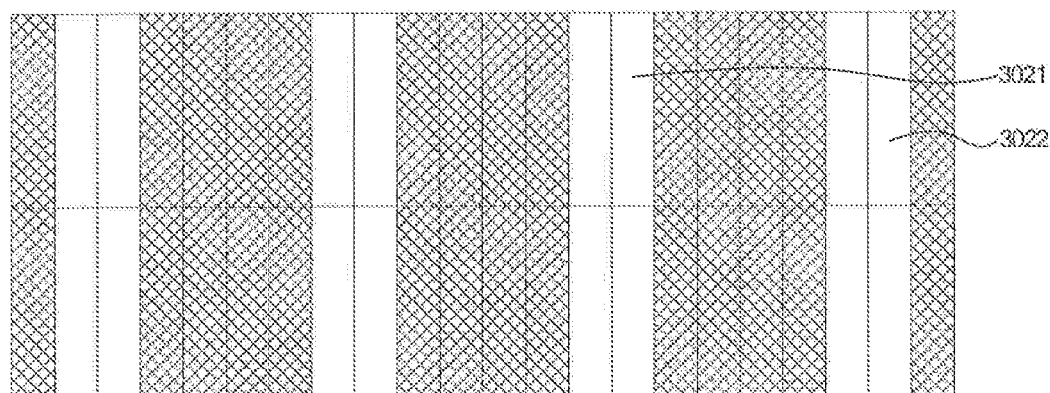
FIG. 3(b) is a plane structural diagram illustrating a second mask of the mask group according to the embodiments of the disclosure.

As shown in FIG. 3(b), the second mask is configured for manufacturing the second sub pixel, the second mask is the mask described above, the width s of an opening region 3021 is twice of the width p of one sub pixel, and the width w of a shielding region 3022 between two adjacent opening regions 3021 is four times of the width p of one sub pixel; in the case that the second mask and the first mask are completely overlapped with each other, a vertical projection of the opening region 3021 of the second mask on the first mask and the opening region 3011 of the first mask are alternately distributed, and a distance between the vertical projection of the opening region 3021 of the second mask on the first mask and the opening region 3011 of the first mask, which is adjacent to the vertical projection of the opening region 3021 of the second mask on the first mask, is the width p of one sub pixel.

Figure 3C:
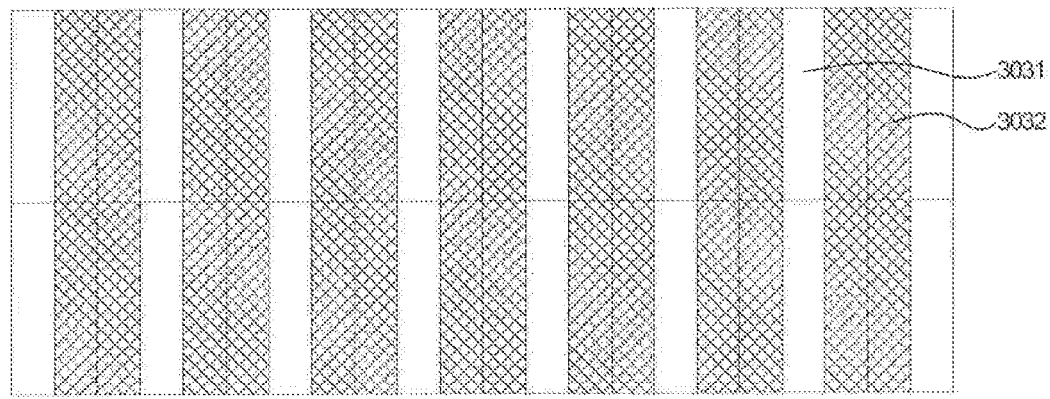
FIG. 3(c) is a plane structural diagram illustrating a third mask of the mask group according to the embodiments of the disclosure.

As shown in FIG. 3(c), the third mask is configured for manufacturing the third sub pixel, the third mask comprises an opening region 3031 and a shielding region 3032 which are alternately arranged, a width of the opening region 3031 is the width p of one sub pixel, and the width w of the shielding region 3032 between two adjacent opening regions 3031 of the third mask is twice of the width p of one sub pixel; in the case that the first mask, the second mask and the third mask are completely overlapped with one another, the vertical projection of the opening region 3021 of the second mask on the first mask and the vertical projection of the opening region of the third mask on the first mask are completely overlapped with the shielding region between two adjacent opening regions of the first mask.

The masks for manufacturing the sub pixels of two colors (namely, the first mask and the second mask) adopt the structure of the mask according to the embodiments of the disclosure, the mask for manufacturing the sub pixel of the remaining one color (namely, the third mask) adopts the structure of a conventional mask in the prior art, and the opening regions of the three masks are staggered without overlapping after the three masks are completely overlapped, so the pixel structure satisfying the practical needs can be manufactured on different positions of the display plane of the display device.

As the first mask and the second mask which are adopted in the mask group have the structure that two sub pixels are exposed by one opening region and four sub pixels are shielded by one shielding region, namely, in one manufacturing process, two sub pixels with the same color can be manufactured at the same time. Compared with the mask in the prior art, if the widths of the opening regions of the first and second masks are equal to the width of the opening region of the mask in the prior art, the width of the sub pixels manufactured by the mask group is half that of the prior art, so the PPI of the display device is improved; if the widths of the opening regions of the first and second masks are larger than that of the opening region of the mask in the prior art but smaller than twice of the width of the opening region of the mask in the prior art, the width of the sub pixels manufactured by the mask group is reduced, and the thicknesses of the masks can be properly increased, so the mask group can not only improve the PPI but also reduce the manufacturing difficulty of the masks; if the widths of the opening regions of the first and second masks is twice that of the opening region of the mask in the prior art, the first and second masks in the mask group can be made thicker, so the manufacturing difficulty of the first and second masks is reduced.

For example, the leftmost region in the first mask is the shielding region and the width of the leftmost region in the first mask is four times of the width p of one sub pixel; the leftmost region in the second mask is the shielding region, and the width of the leftmost region in the second mask is the width p of one sub pixel; the leftmost region in the third mask is the opening region, and the width of the leftmost region in the third mask is the width p of one sub pixel. Therefore, arrangement of the sub pixels in each line from left to right in the finally obtained pixel structure is: the third sub pixel, the second sub pixel, the second sub pixel, the third sub pixel, the first sub pixel, the first sub pixel, the third sub pixel, the second sub pixel, the second sub pixel, the third sub pixel, the first sub pixel, the first sub pixel, the third sub pixel, the second sub pixel . . . , it is thus clear that the sub pixels in each line takes the first sub pixel, the third sub pixel, the second sub pixel, the second sub pixel, the third sub pixel and the first sub pixel as a repetition unit; and the pixel formed by the first sub pixel, the third sub pixel and the second sub pixel and the pixel formed by the second sub pixel, the third sub pixel and the first sub pixel are alternately arranged.

For example, the first sub pixel manufactured by the first mask is a red sub pixel, the second sub pixel manufactured by the second mask is a blue sub pixel, and the third sub pixel manufactured by the third mask is a green sub pixel, so that each pixel comprises all colors needed by the full-color display of the display device. However, the colors of the sub pixels manufactured by the three masks contained in the mask group are not limited thereto.

The embodiments of the disclosure provide a manufacturing method of pixels, the manufacturing method adopts the abovementioned mask group, and the manufacturing method comprises: manufacturing the first sub pixel by using the first mask in the mask group; manufacturing the second sub pixel by using the second mask in the mask group; and manufacturing the third sub pixel by using the third first mask in the mask group.

As the first and second masks adopted by the method has the advantages of improving the PPI and reducing the manufacturing difficulty of the masks, the PPI of the display device and the manufacturing difficulty of the masks can be reduced by adopting the manufacturing method of pixels.

For example, the processes for manufacturing the first, second and third sub pixels respectively adopt an evaporation process.

The manufacturing the first sub pixel, the manufacturing the second sub pixel and the manufacturing the third sub pixels may be performed in no specific order, and the specific order may, preferably, be adjusted according to practical requirements.

For example, the first sub pixel is a red sub pixel, the second sub pixel is a blue sub pixel, and the third sub pixel is a green sub pixel.

Figure 4:
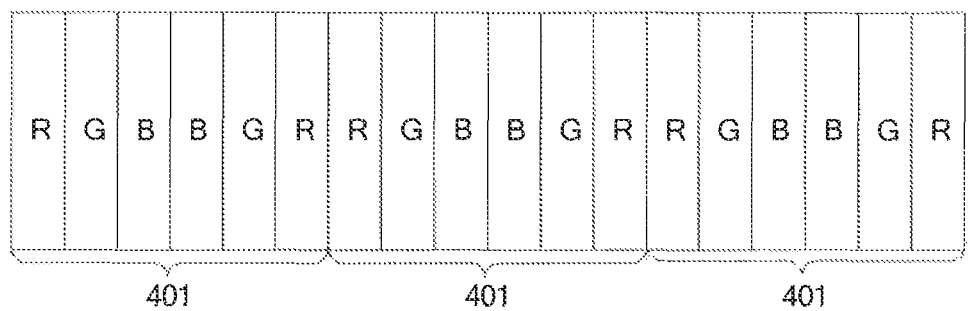
FIG. 4 is a plane diagram illustrating a pixel structure according to the embodiments of the disclosure.

The embodiments of the disclosure further provide a pixel structure which is manufactured by using the above manufacturing method. As shown in FIG. 4, the pixel structure comprises a plurality of pixel repetition units 401, and each pixel repetition unit 401 comprises six sub pixels of the first sub pixel, the third sub pixel, the second sub pixel, the second sub pixel, the third sub pixel and the first sub pixel which are arranged sequentially. Each pixel repetition unit 401 comprises two pixels, and in each line of the sub pixels, the pixel formed of the first sub pixel, the third sub pixel and the second sub pixel and the pixel formed of the second sub pixel, the third sub pixel and the first sub pixel are alternately arranged.

If the first sub pixel is a red sub pixel, the second sub pixel is a blue sub pixel and the third sub pixel is a green sub pixel, the arrangement of the sub pixels in each line is as shown in FIG. 4.

As the mask group is adopted to form the pixel structure, the width of each sub pixel of the pixel structure is reduced compared with that of the prior art, and the PPI is improved; and as the manufacturing difficulty of the adopted mask group is reduced, the manufacturing cost of the adopted mask group is reduced, so that the production cost of the pixel structure is reduced.

The foregoing embodiments merely are exemplary embodiments of the disclosure, and not intended to define the scope of the disclosure, and the scope of the disclosure is determined by the appended claims.

The present application claims priority of Chinese Patent Application No. 201410421343.5 filed on Aug. 25, 2014, the disclosure of which is incorporated herein by reference in its entirety as part of the present application.

What is claimed is:

1. A mask, comprising a shielding region and an opening region which are alternately arranged, wherein
a width of the opening region is twice of a width of one sub pixel, and a width of the shielding region between two adjacent opening regions is four times of the width of one sub pixel.

2. The mask according to claim 1, wherein a leftmost region in the mask is the shielding region or the opening region.

3. The mask according to claim 2, wherein a width of the leftmost region in the mask is one, two, three or four times of the width of one sub pixel.

4. The mask according to claim 2, wherein the leftmost regions of the masks for forming sub pixels of different colors are different.

5. A mask group, for manufacturing a first sub pixel, a second sub pixel and a third sub pixel of different colors, and comprising:
a first mask configured for manufacturing the first sub pixel, the first mask being the mask in claim 1;
a second mask configured for manufacturing the second sub pixel, the second mask being the mask in claim 1, wherein in the case that the second mask and the first mask are completely overlapped with each other, a vertical projection of the opening region of the second mask on the first mask and the opening region of the first mask are alternately distributed, and a distance between the vertical projection of the opening region of the second mask on the first mask and the opening region of the first mask, which is adjacent to the vertical projection of the opening region of the second mask on the first mask, is the width of one sub pixel;
a third mask configured for manufacturing the third sub pixel, wherein the third mask comprises an opening region and a shielding region which are alternately arranged, a width of the opening region is the width of one sub pixel, and the width of the shielding region between two adjacent opening regions of the third mask is twice of the width of one sub pixel; in the case that the first mask, the second mask and the third mask are completely overlapped with one another, the vertical projection of the opening region of the second mask on the first mask and a vertical projection of the opening region of the third mask on the first mask are completely overlapped with the shielding region between two adjacent opening regions of the first mask.

6. The mask group according to claim 5, wherein a leftmost region in the first mask is the shielding region, and a width of the leftmost region in the first mask is four times of the width of one sub pixel.

7. The mask group according to claim 6, wherein the first sub pixel manufactured by the first mask is a red sub pixel.

8. The mask group according to claim 5, wherein a leftmost region in the second mask is the shielding region, and a width of the leftmost region in the second mask is the width of one sub pixel.

9. The mask group according to claim 8, wherein the second sub pixel manufactured by the second mask is a blue sub pixel.

10. The mask group according to claim 5, wherein a leftmost region in the third mask is the opening region, and a width of the leftmost region in the third mask is the width of one sub pixel.

11. The mask group according to claim 10, wherein the third sub pixel manufactured by the third mask is a green sub pixel.

12. A pixel structure, manufactured by mask group in claim 5.

13. The pixel structure according to claim 12, wherein the pixel structure comprises a plurality of pixel repetition units, and each pixel repetition unit comprises six sub pixels of the first sub pixel, the third sub pixel, the second sub pixel, the second sub pixel, the third sub pixel and the first sub pixel which are arranged sequentially.

14. The pixel structure according to claim 13, wherein the first sub pixel is a red sub pixel, the second sub pixel is a blue sub pixel, and the third sub pixel is a green sub pixel.

15. The pixel structure according to claim 12, wherein in each line of the sub pixels, the pixel formed of the first sub pixel, the third sub pixel and the second sub pixel and the pixel formed of the second sub pixel, the third sub pixel and the first sub pixel are alternately arranged.

16. The pixel structure according to claim 12, wherein a leftmost region in the first mask is the shielding region, and a width of the leftmost region in the first mask is four times of the width of one sub pixel.

17. The pixel structure according to claim 12, wherein a leftmost region in the second mask is the shielding region, and a width of the leftmost region in the second mask is the width of one sub pixel.

18. The pixel structure according to claim 12, wherein a leftmost region in the third mask is the opening region, and a width of the leftmost region in the third mask is the width of one sub pixel.

* * * * *